(12) United States Patent
Sevskiy et al.

(10) Patent No.: US 12,237,825 B2
(45) Date of Patent: Feb. 25, 2025

(54) FILTER DEVICE COMPRISING TWO CONNECTED FILTER CIRCUITS

(71) Applicant: RF360 SINGAPORE PTE. LTD., Republic Plaza (SG)

(72) Inventors: Georgiy Sevskiy, Munich (DE); Stefan Freisleben, Neubiberg (DE); Patric Heide, Vaterstetten (DE); Oleksandr Ruban, Munich (DE); Igor Ielegechev, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 287 days.

(21) Appl. No.: 17/628,201

(22) PCT Filed: Jul. 9, 2020

(86) PCT No.: PCT/EP2020/069405
§ 371 (c)(1),
(2) Date: Jan. 18, 2022

(87) PCT Pub. No.: WO2021/018543
PCT Pub. Date: Feb. 4, 2021

(65) Prior Publication Data
US 2022/0255529 A1 Aug. 11, 2022

(30) Foreign Application Priority Data
Jul. 26, 2019 (DE) .................... 10 2019 120 312.0

(51) Int. Cl.
*H03H 9/05* (2006.01)
*H03H 9/72* (2006.01)
(Continued)

(52) U.S. Cl.
CPC ........ *H03H 9/0576* (2013.01); *H03H 9/0561* (2013.01); *H03H 9/725* (2013.01); *H03H 9/74* (2013.01); *H03H 2001/0085* (2013.01)

(58) Field of Classification Search
CPC .. H03H 9/058; H03H 9/0576; H03H 9/02535; H03H 9/0028; H03H 9/0009
(Continued)

(56) References Cited

U.S. PATENT DOCUMENTS 8,081,047 B2   12/2011   Royak et al.
9,178,491 B2   11/2015   Takemura
(Continued)

FOREIGN PATENT DOCUMENTS

CN   1368831 A   9/2002
CN   1499714 A   5/2004
(Continued)

OTHER PUBLICATIONS

International Search Report and Written Opinion—PCT/EP2020/069405—ISA/EPO—Oct. 2, 2020.
(Continued)

*Primary Examiner* — Rakesh B Patel
(74) *Attorney, Agent, or Firm* — Polsinelli

(57) ABSTRACT

A filter device having a reduced sensitivity to production tolerances comprises a multilayer panel with integrated wiring, a piezoelectric substrate mounted to the panel. A first filter circuit ($FC_1$) and a signal path (SP) comprising a second filter circuit are realized on the substrate and connected to a common antenna terminal (AT) as well as to a common node (CN) located on top of the piezoelectric substrate. A first matching circuit ($MC_1$) and further matching circuits ($MC_2$) are realized by the wiring in the multilayer panel.

10 Claims, 11 Drawing Sheets

Figure 1:
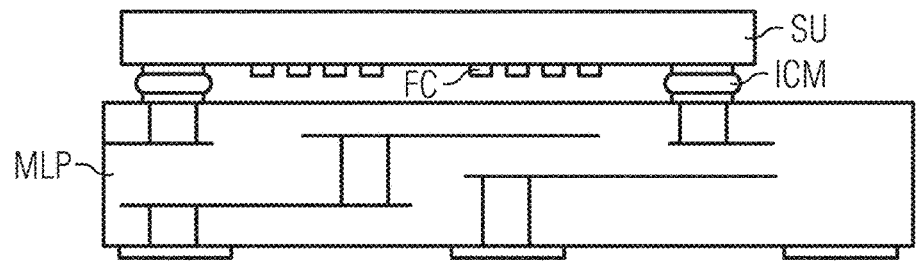

(51) Int. Cl.
*H03H 9/74* (2006.01)
*H03H 1/00* (2006.01)

(58) Field of Classification Search
USPC .................................................. 333/186, 193
See application file for complete search history.

(56) References Cited

U.S. PATENT DOCUMENTS

| | | |
|---|---|---|
| 2013/0222077 A1 | 8/2013 | Ota |
| 2015/0130680 A1 | 5/2015 | Link et al. |
| 2015/0236390 A1* | 8/2015 | Analui ............... H03H 9/547 |
| | | 333/117 |
| 2015/0236840 A1 | 8/2015 | Link et al. |
| 2016/0156329 A1* | 6/2016 | Takeuchi ............ H03H 9/605 |
| | | 333/32 |
| 2017/0077896 A1 | 3/2017 | Sugaya et al. |

FOREIGN PATENT DOCUMENTS

| | | |
|---|---|---|
| CN | 102611410 A | 7/2012 |
| JP | 2005020140 A | 1/2005 |
| WO | 2008132212 | 11/2008 |

OTHER PUBLICATIONS

Kim D., et al., "A Compact WiMAX Diplexer Module with LTCC and FBAR Technologies", In: European Microwave Conference (EuMC), 2009, pp. 567-570, DOI: 10.23919/EUMC.2009.5296174.

Yuanwang H., "Research on the Technology of High Density Assembled Digital T/R Modules", Chinese Excellent Master's Thesis Full Text Database (Information Technology Collection), Mar. 15, 2016, 81 Pages.

* cited by examiner

FIG 11
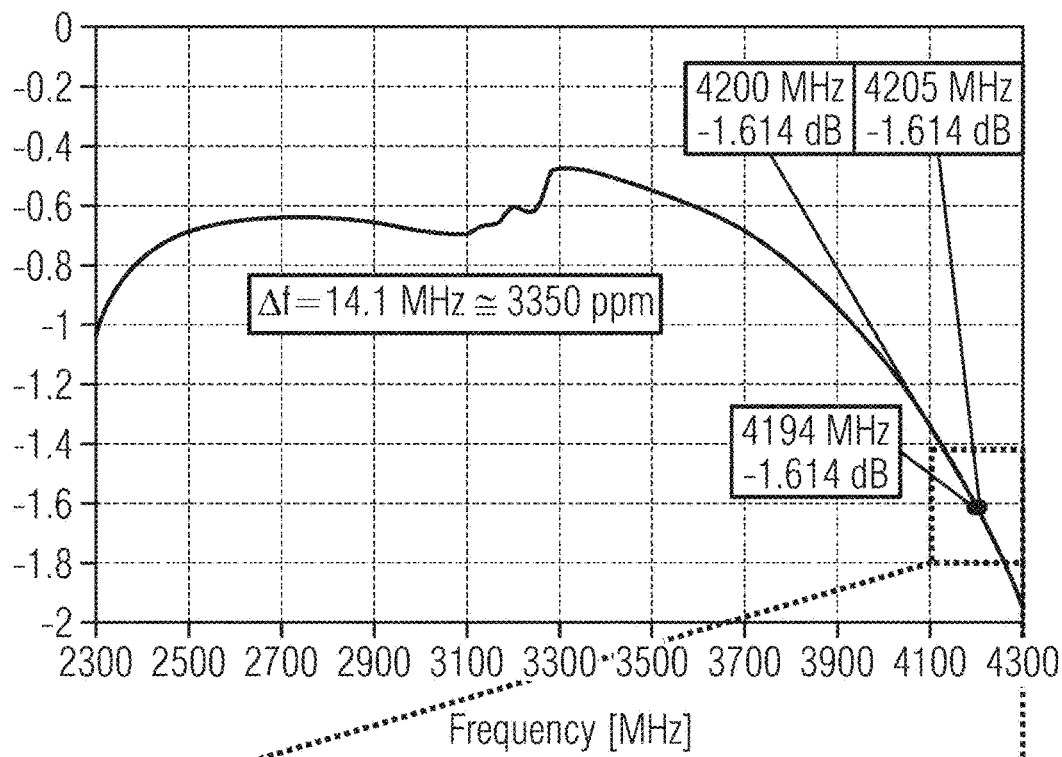
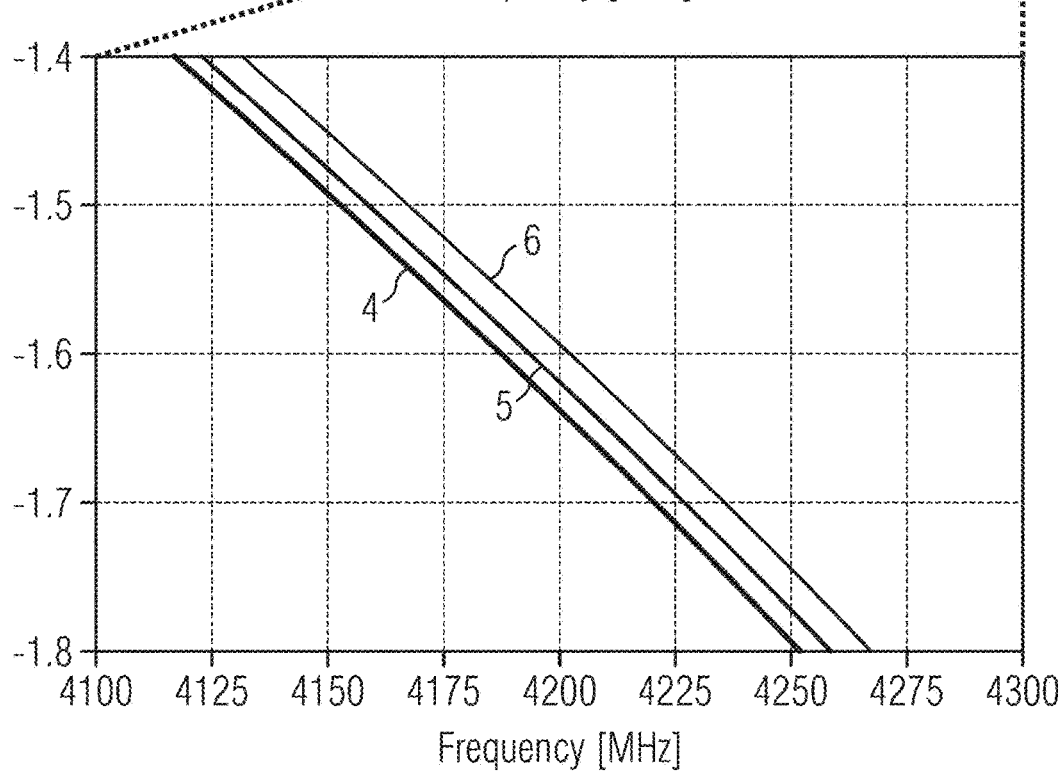

FIG 12
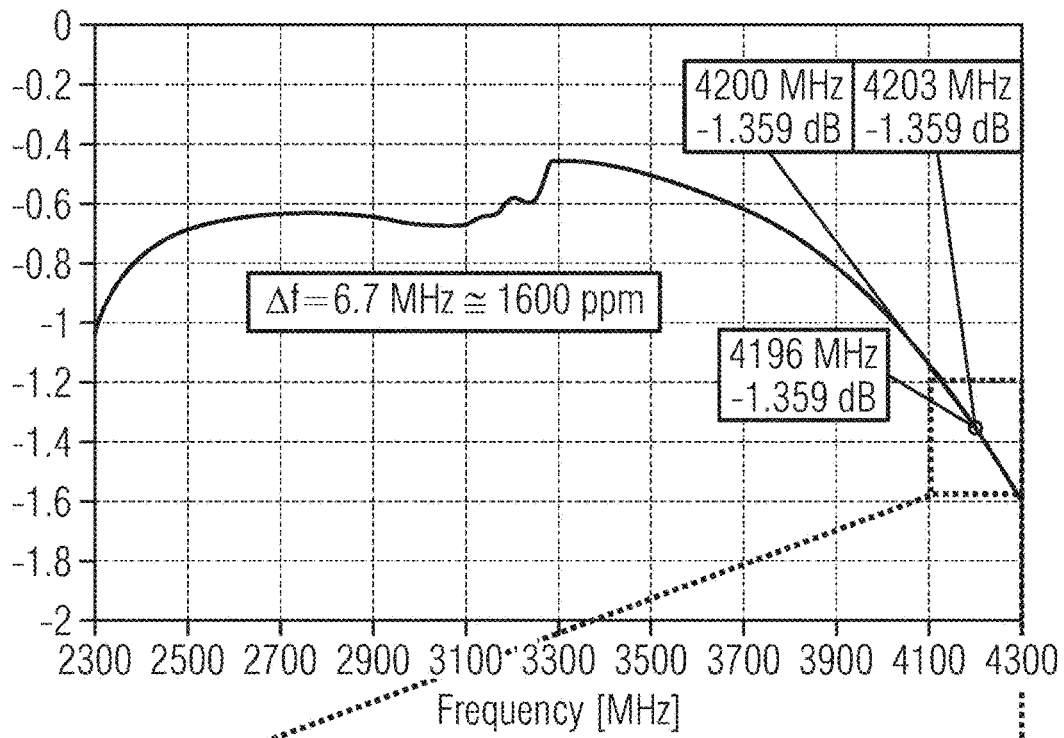
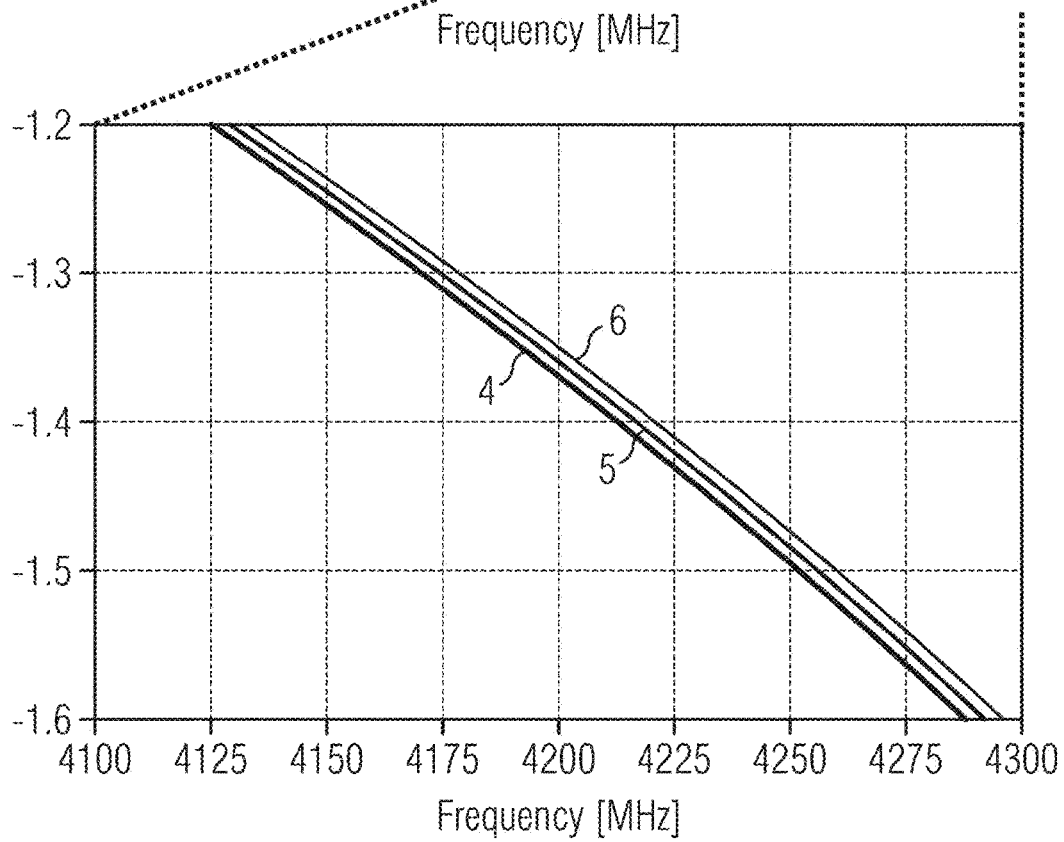

FIG 13
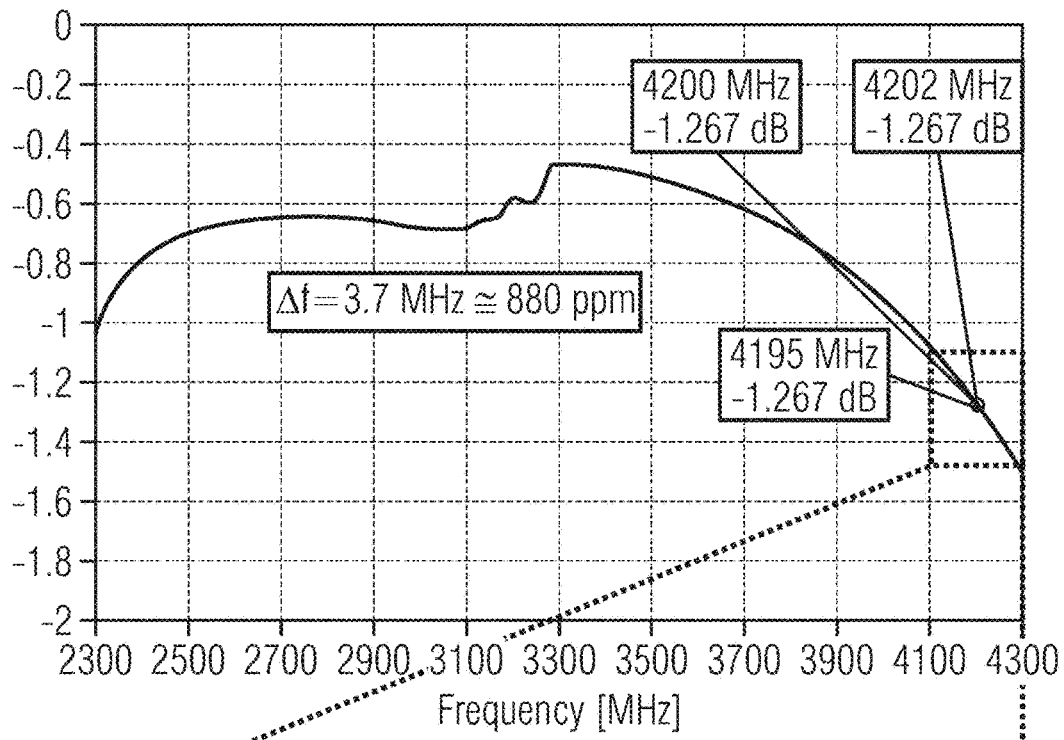
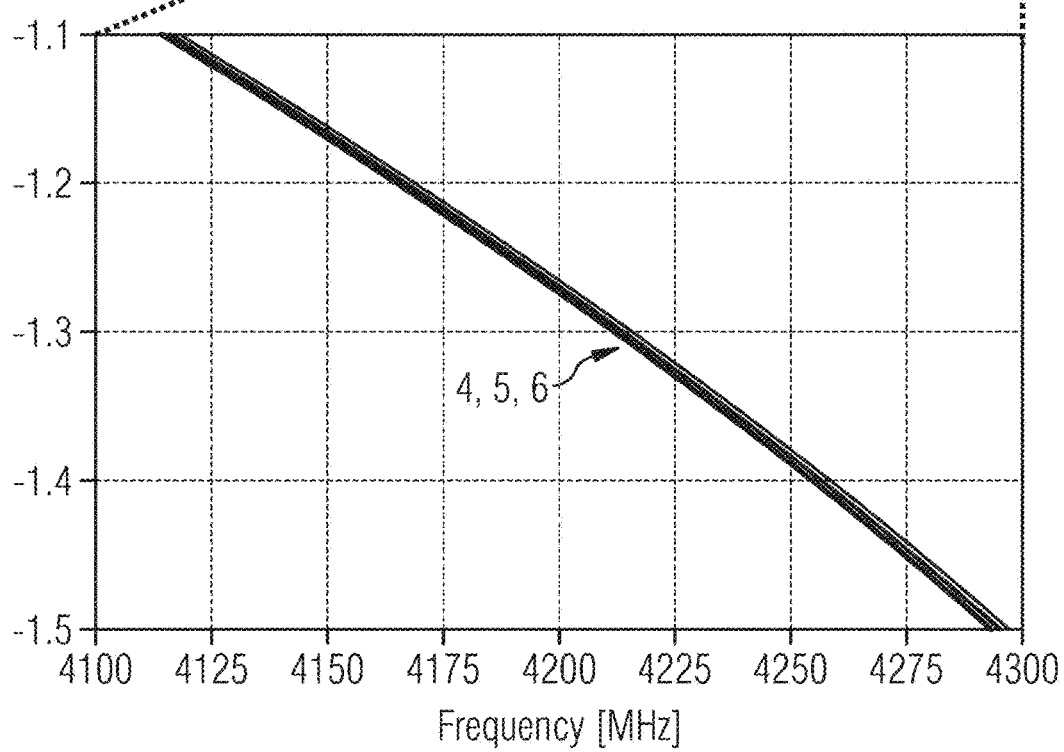

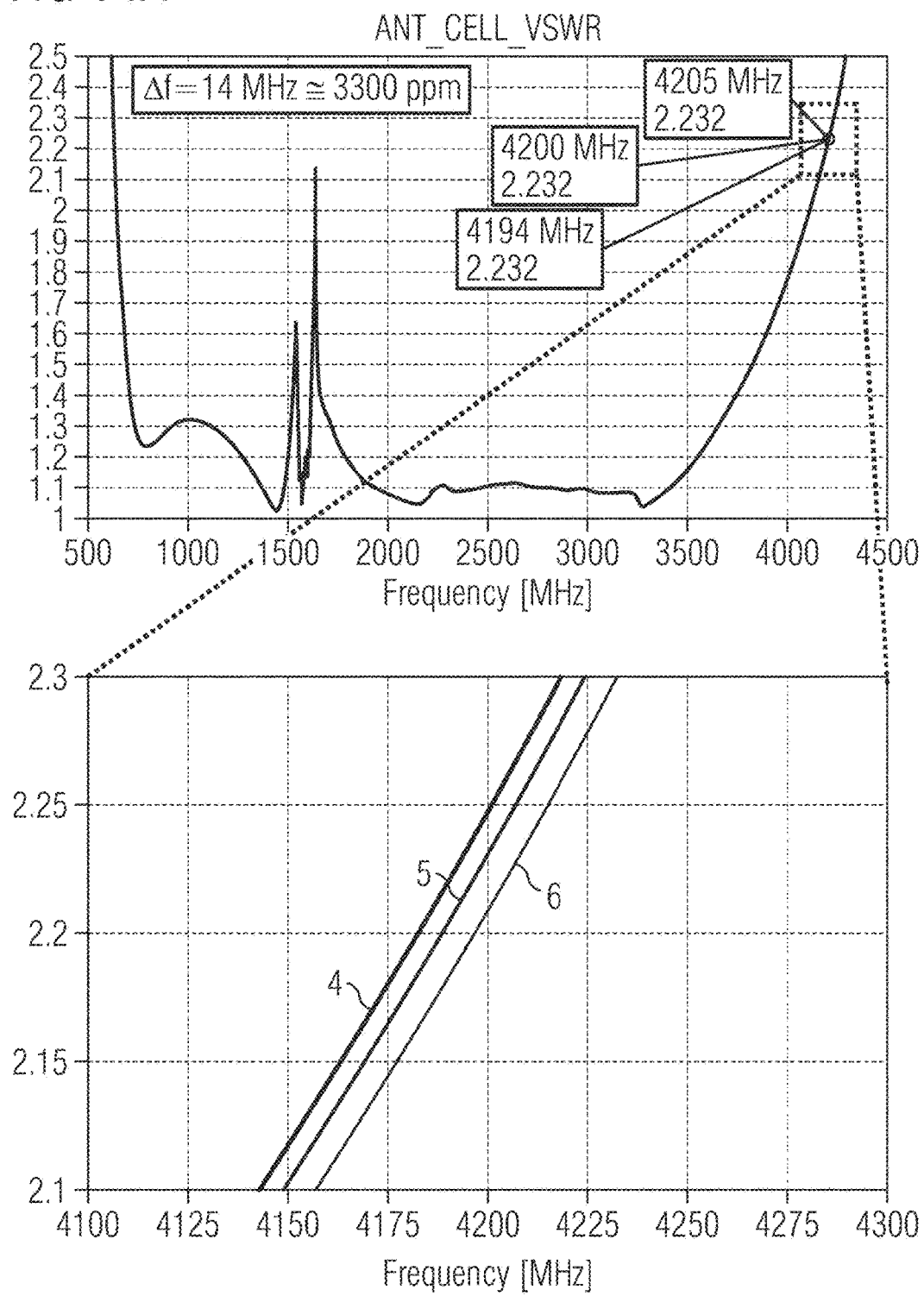

FILTER DEVICE COMPRISING TWO CONNECTED FILTER CIRCUITS

The invention relates to a filter device that is usable for mobile phone applications. According to a preferred embodiment the filter devices comprises an ultra-wide-band GPS extractor for 5G mobile phone applications.

Modern filter devices comprise more than one filter circuit. Each filter circuit may be designed for filtering out a desired frequency band and to separate from signals having other frequencies. It is preferable to implement as much filter circuits as possible on a common chip to save costs, to shorten connection lines and improve the insertion loss. Generally these devices are named 2-in-one, 3-in-one or higher integrated devices.

Examples where two or more filter circuits are circuited together and connected to the same antenna are e.g. duplexer, multiplexer or extractors. Usually at least one of the filter circuits needs a matching to avoid problems when connecting these circuits to a common node to enable a duplex function for example. Further matching is required to match the two circuits to an antenna terminal.

A substantial problem often occurs at filter devices with two or more connected filter circuits, as it could be shown that unavoidable production tolerances yield a too wide spread of filter properties. It has been found that production tolerances can have a strong impact on the value of parasitic elements of the filter device. An example is a parasitic inductances that may be introduced by a bump connection or other interconnecting mean at the device. A small variation of e.g. a bump height causes a variation of the respective parasitic inductance thereof that in turn may cause an undesired variation of the filter performance.

The main problem when implementing GPS Extractors is to provide a very wideband performance which is not very sensitive to the production tolerances, as for example to the height of solder bump connections between carrier substrate and the filter chip.

It is hence an object to improve the performance of a filter device by reducing its sensitivity to production tolerances. A further object is to provide an ultra-wide-band GPS extractor for 5G mobile phone applications.

The main problem when implementing GPS Extractors is to provide a very wideband performance which is not very sensitive to the production tolerances, as for example to the height of solder bump connections between carrier substrate and the SAW chip.

This and other objects are met by a filer device according to independent claim 1. Advantageous further features and specific embodiments can be taken from the dependent claims.

A filter device comprises a carrier like a multilayer panel with an integrated wiring. A piezoelectric substrate is mounted onto the top surface of the panel. In a flip-chip arrangement pads on the active surface side of the substrates are connected to respective contact areas on the panel.

On the substrate a first filter circuit and as well as a signal path are realized and connected to a common node on the surface of the substrate. The common node is formed as a pad and is further connected to an antenna terminal on the panel. The signal path comprises at least a second filter circuit. First and second filter circuit may be realized in SAW technique.

A first matching circuit circuited between the common node and the signal path is realized by the wiring in the multilayer panel.

The key feature of the proposed filter device is the kind of implementation of the connection of the first filter circuit and the signal path. Whereas up to now it has always been a design rule to locate all wiring and all passive matching elements on the carrier like the multilayer panel and to connect the filter circuit on the shortest way to the panel, now, the common node is placed on the surface of the substrate facing the panel. As the first matching circuit placed between common node and signal path is realized on the panel a first connects the common node to a first end of the first matching circuit. A second end of the matching circuit is connected via an interconnection to a pad on the surface of the substrate. The pad is connected the signal path on the substrate.

With such an arrangement the sensitivity of the filter device to production tolerances causing parasitic inductances can be reduced substantially. Moreover, the properties of the filter circuits that is position of the band edge, insertion loss and bandwidth can be set more precisely.

Accordingly a first matching circuit realized by the wiring in the multilayer panel is circuited into a series line between the signal path and the common node. A first section of the series line arranged on the substrate connects the common node and a first pad. A second section of the series line is arranged on the substrate and connects a second pad and the signal path comprising the second filter circuit. A first interconnecting means connects the first pad to a first end of the first matching circuit and a second interconnecting means connects the second pad to a second end of the first matching circuit.

A second matching circuit may be circuited between the antenna and the common node.

According to an embodiment at least one of the filter circuits comprises SAW resonators.

The filter device may one of a duplexer, a multiplexer or an extractor.

According to an embodiment the filter device is an extractor wherein the first filter circuit is a band pass filter for GPS and/or GNSS signals. The signal path then may comprise one or more further filter circuits chosen from band pass, high pass, low pass, band stop, diplexer or duplexer. Further the filter device may be frontend module operating in a multitude of bands with one or more antennas. Switching means may serve to actively switch between different filter elements or further signal paths. The frontend module can connect the antenna to a desired input or output terminal that is to a Tx or Rx section.

In the filter device comprising or being an extractor the first matching circuit circuited in a series line between the signal path and the common node and comprises a band stop for GPS/GNSS frequencies.

Within the described extractor the signal path has a VWSR of less than 2 between 617 MHz and 4.2 GHz with the exception of the region around the GPS/GNSS frequencies that is blocked by the band stop between antenna and common node.

In a variant the filter device comprises a second matching circuit circuited between the antenna terminal and the common node. This second matching circuit comprises a series coil to match the antenna to the first filter circuit and to the signal path.

Each interconnect between any pad on the substrate and a respective contact area on the surface of the panel may comprise or be a bump.

It is advantageous to locate an interconnect between the antenna terminal and a respective pad on the substrate near the corner of the substrate.

The multilayer panel comprises one of a laminate, a HTCC and a LTCC. Structured metallization plane arranged between dielectric ceramic or laminate layers are electrically interconnected by vias and may form passive elements chosen from resistors, capacitors and inductances. A matching circuit can be formed by proper circuiting some of these integrated elements such as the first and second matching circuit of the filter device.

In the following the invention will be explained in more detail with reference to specific embodiments and the accompanied figures. The figures are schematic only and may not show all elements as far as these omitted elements are known in the art can easily be complemented by skilled worker. Moreover the figures are not drawn to scale and some details may be depicted enlarged for better understanding.

Figure 2:
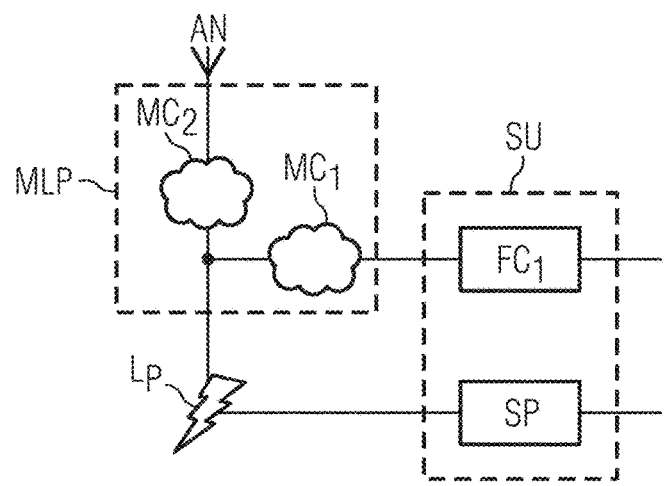
Figure 3:
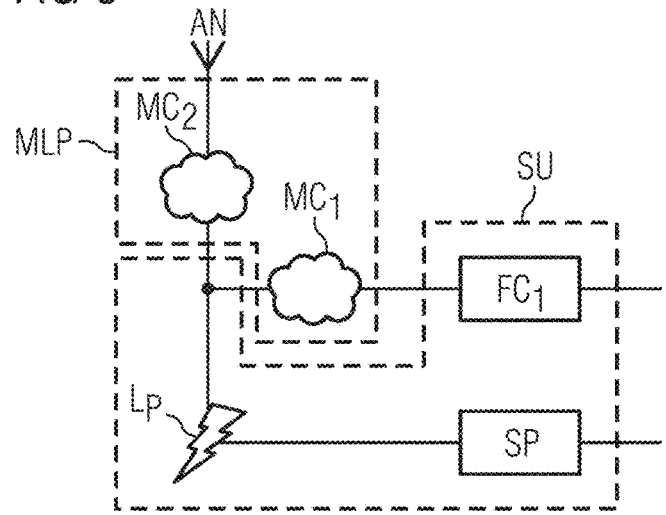
Figure 4:
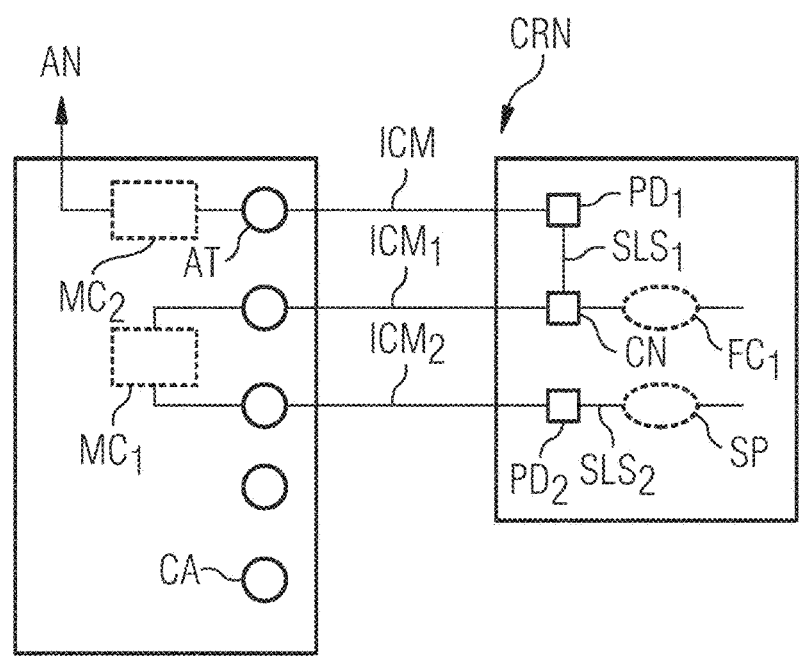
Figure 5:
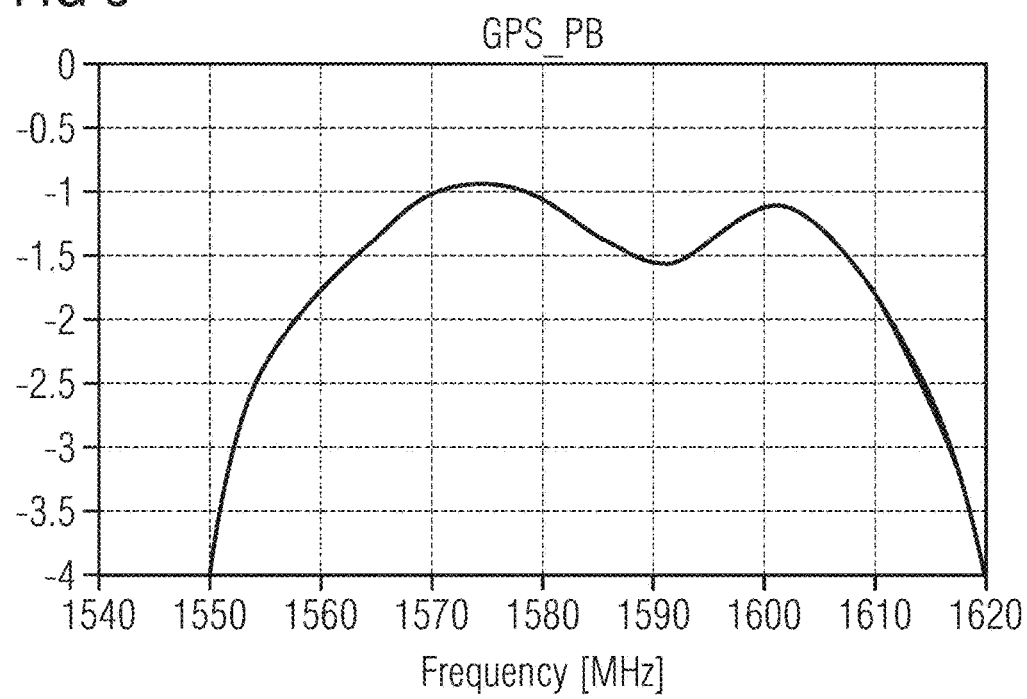
Figure 6:
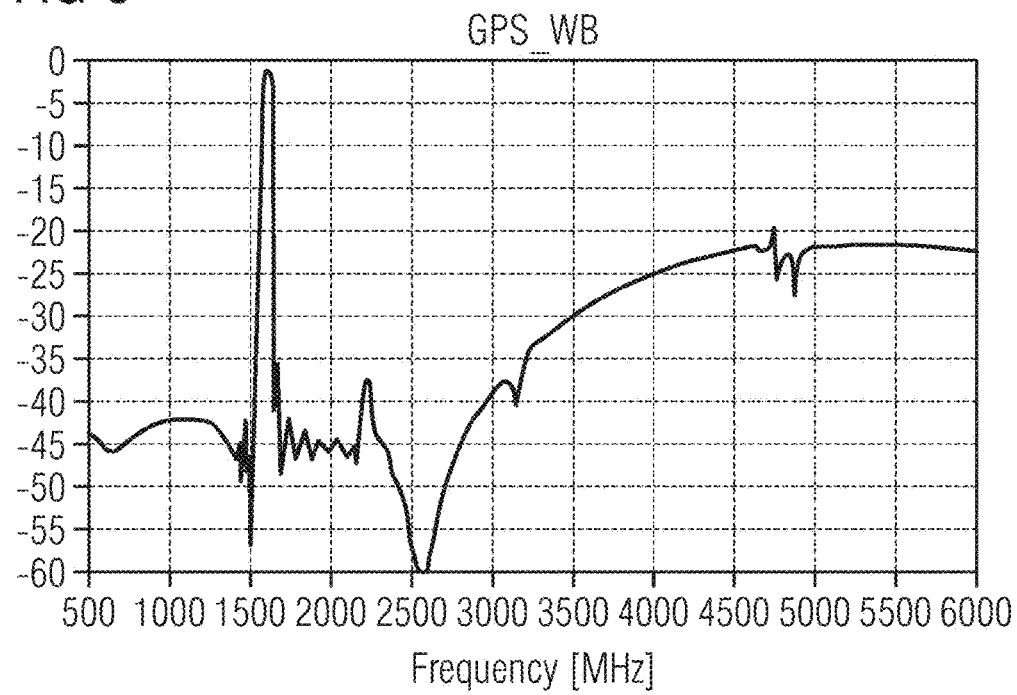
Figure 7:
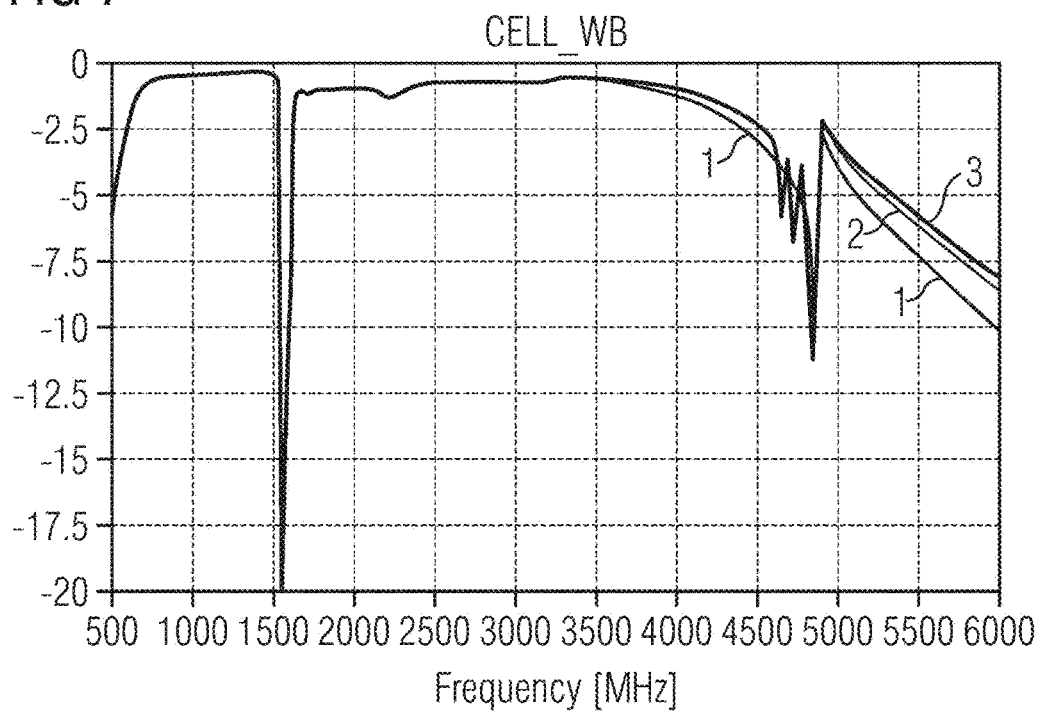
Figure 8:
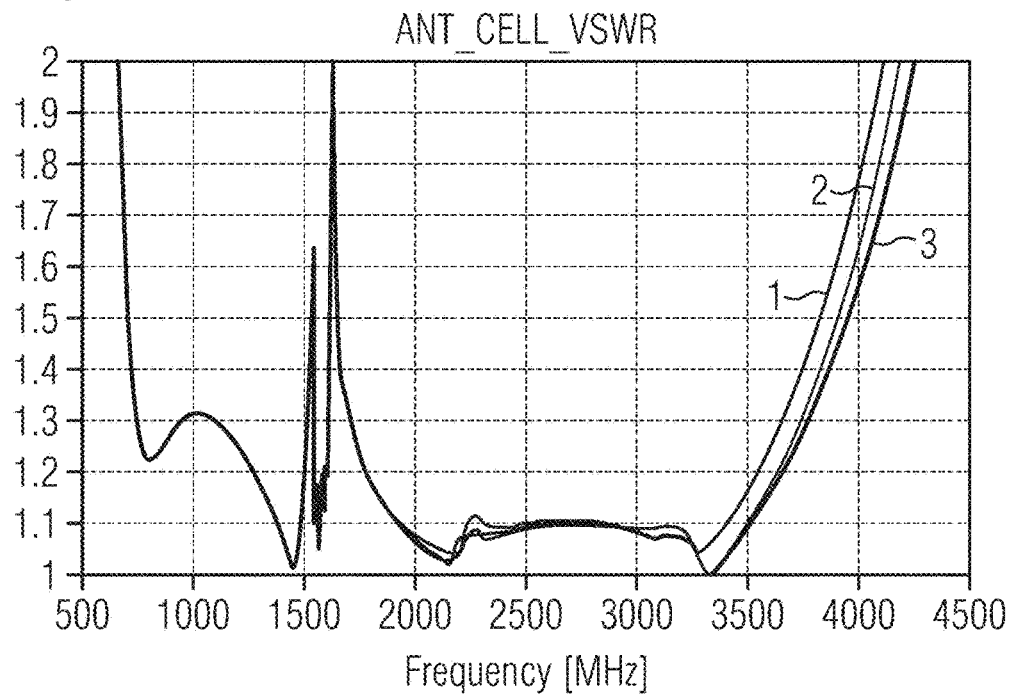
Figure 9:
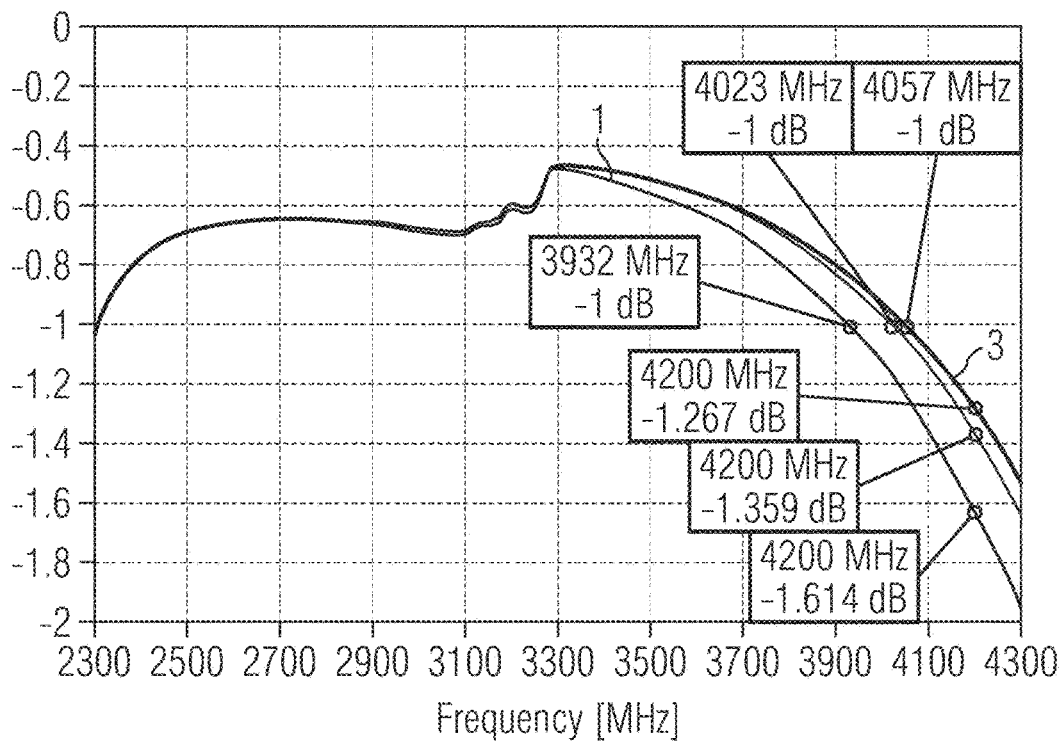
Figure 10:
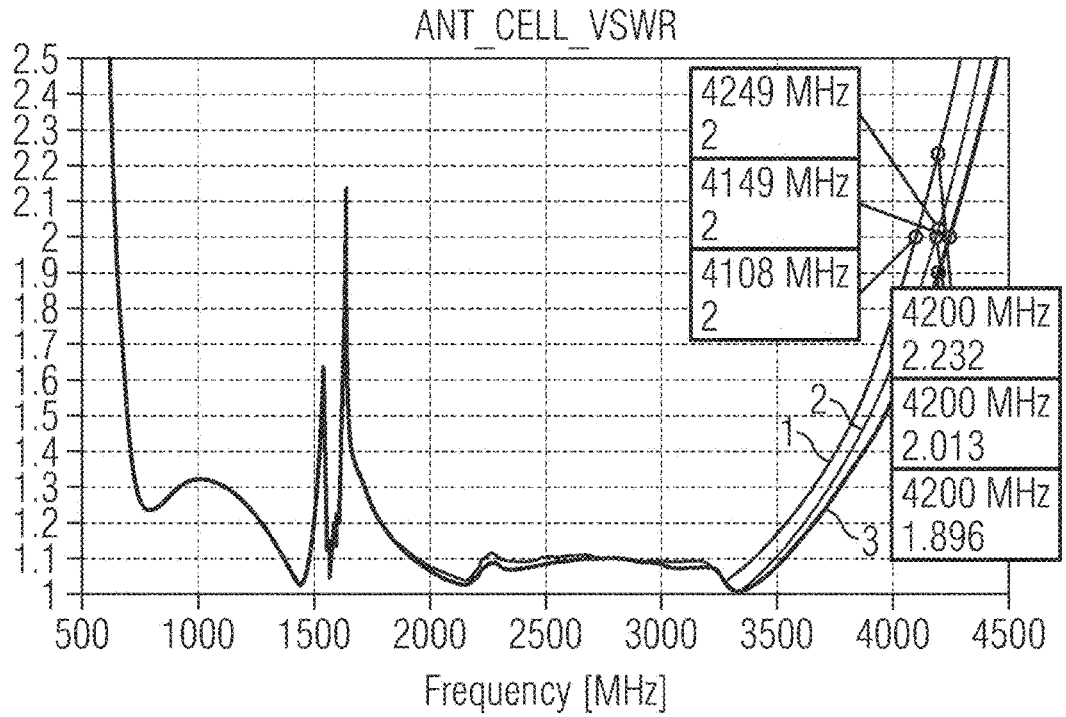
Figure 14B:
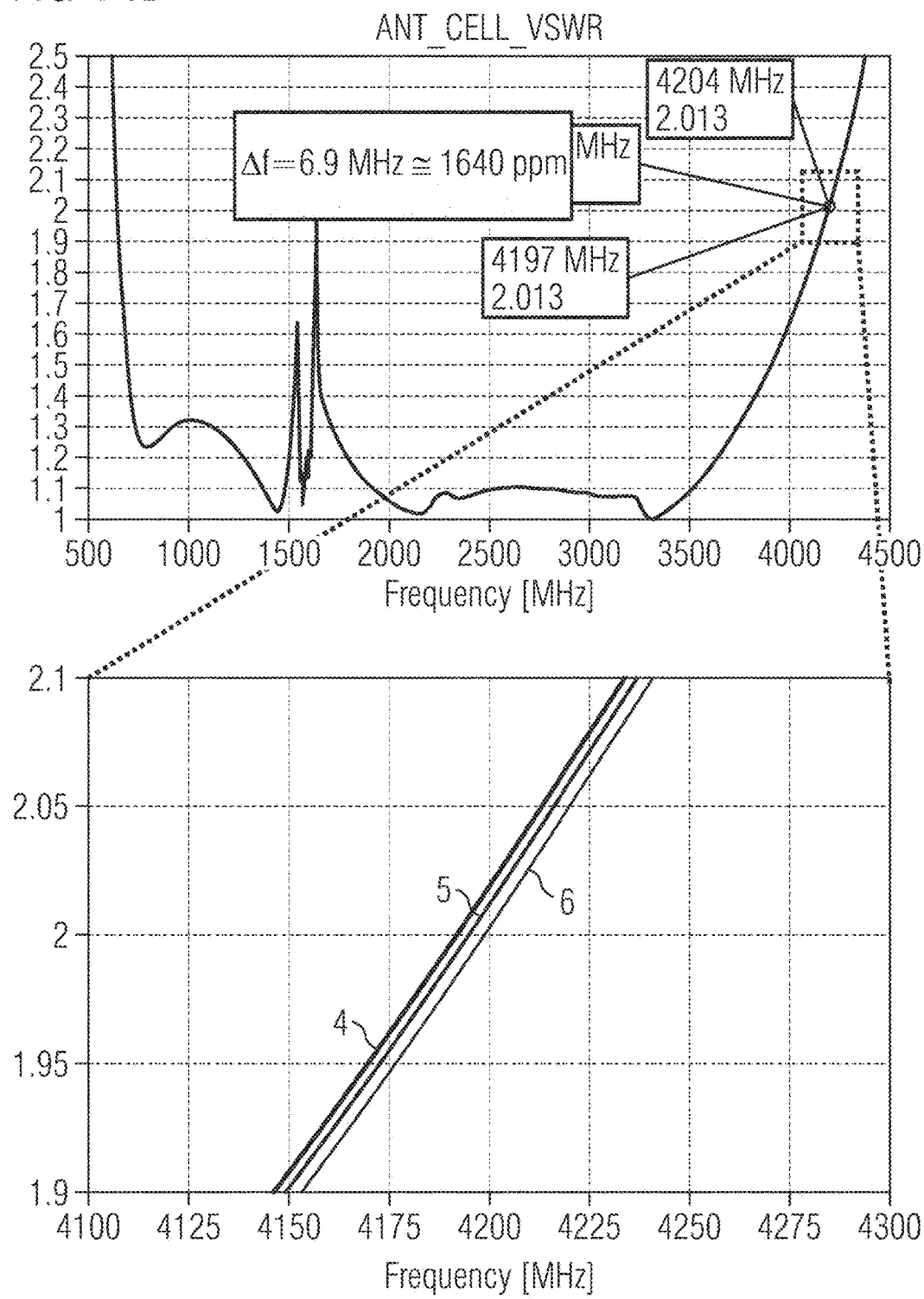
Figure 14C:
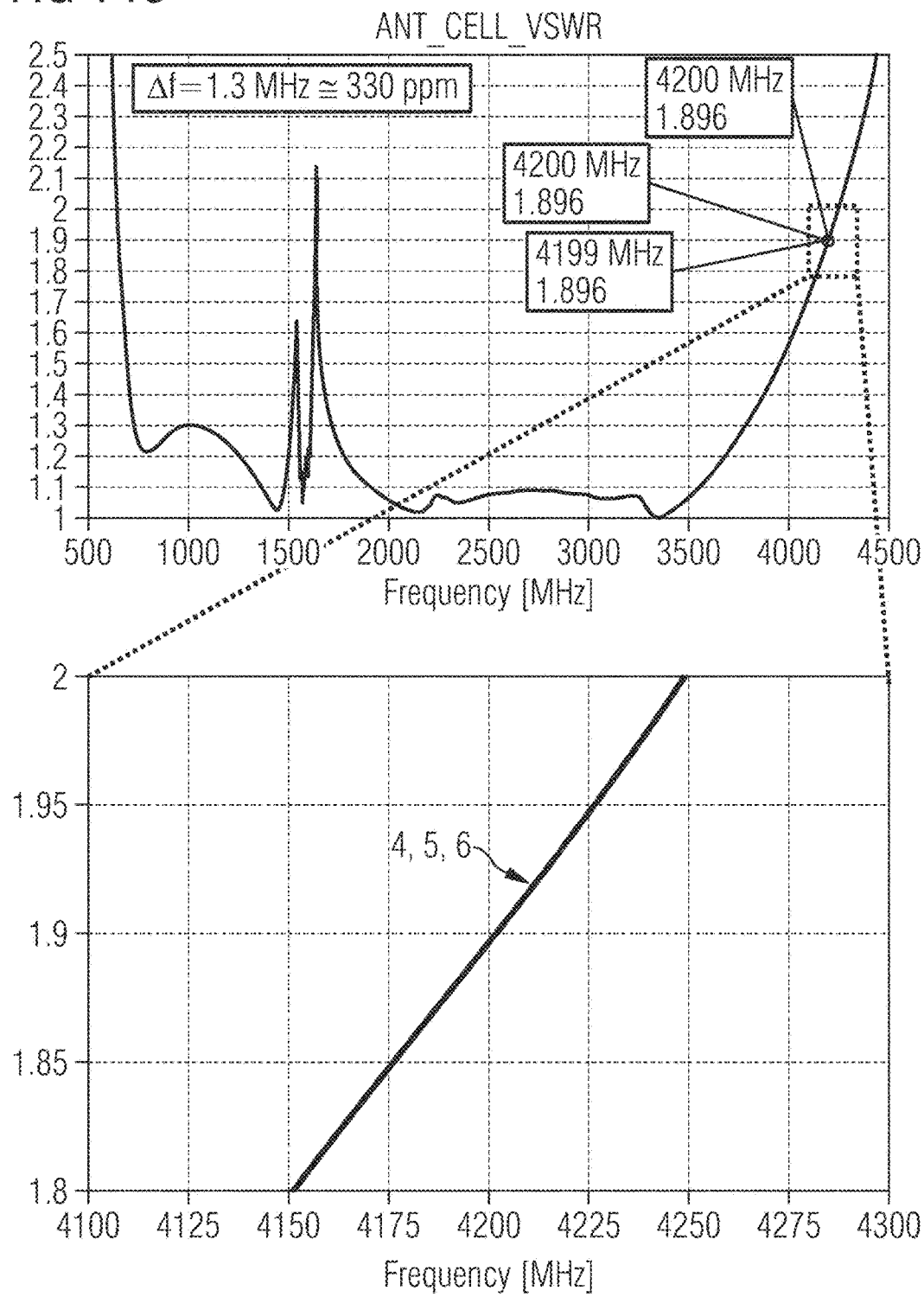

FIG. 1 shows a SAW filter device according to the art in a schematic cross section FIG. 2 shows a schematic block diagram of a filter device according to the art FIG. 3 shows a schematic block diagram of a filter device according to the invention FIG. 4 shows schematically an exemplary circuiting of the multilayer panel and the piezoelectric substrate according to an embodiment of the invention FIG. 5 shows in a narrow band depiction the transfer curves between the antenna and the output terminal of the first filter circuit according to two embodiment of the invention and a reference device according to the art wherein the filter device is an extractor and the first filter circuit is a band pass for GPS/GNSS FIG. 6 shows the same transfer curves in a broad band depiction FIG. 7 shows the transfer curves between the antenna and the signal path in the same filter devices like FIGS. 5 and 6 are belonging to FIG. 8 shows the reflection curves between the antenna and the signal path in the same filter devices FIG. 9 shows as an enlarged sectional view the right band edge of the transfer curves of FIG. 6 for two different embodiments of the invention compared to a reference device FIG. 10 shows the reflection curves between the antenna and the signal path of two different embodiments of the invention compared to a reference device FIG. 11 shows in the upper part of the figure the effect of production tolerances on the transfer curve of a reference device for three different bump heights and in an enlarged sectional view in the lower part of the figure FIG. 12 shows in the upper part of the figure the effect of production tolerances on the transfer curve of a first embodiment of a filter device for three different bump heights and in an enlarged sectional view in the lower part of the figure FIG. 13 shows in the upper part of the figure the effect of production tolerances on the transfer curve of an improved second embodiment of a filter device for three different bump heights and in an enlarged sectional view in the lower part of the figure FIG. 14A shows in the upper part of the figure the effect of production tolerances on the reflection of the signal path of a reference device for three different bump heights and in an enlarged sectional view in the lower part of the figure FIG. 14B shows in the upper part of the figure the effect of production tolerances on the reflection of the signal path of a first embodiment for three different bump heights and in an enlarged sectional view in the lower part of the figure FIG. 14C shows in the upper part of the figure the effect of production tolerances on the reflection of the signal path of an improved second embodiment for three different bump heights and in an enlarged sectional view in the lower part of the figure FIG. 1 shows a filter device according to the art in a schematic cross section. A SAW filter circuit FC is realized on the surface of a piezoelectric substrate SU. The substrate is flip-chip mounted to the top surface of a multilayer panel MLP using bumps as interconnection means. Thereby pads on the bottom surface of the substrate are connected to contact areas on the top surface of the panel MLP. A wiring is located on the surface of the panel and/or inside the panel. The wiring consists of conductor lines, metalized areas and vias connecting different levels of the multilayer panel. The wiring interconnects the contact areas on top to terminal contacts at the bottom surface of the panel. At the same time passive circuit elements are formed by the wiring and are connected to the filter circuit. Terminal contacts function for connecting the device to an external circuitry like a PCB.

FIG. 2 shows a schematic block diagram of a filter device according to the art. The device is represents GPS/CELL extractor wherein the signal path SP comprises a band pass filter for GPS band around 1585 MHz. The first filter circuit FC1 can let pass all frequencies for the usual cell bands with the exception of the GPS band.

According to general design rules that have up to now proved to be advantageous, main filtering functionality of both signal path SP (CPS path) and first filter circuit (cell) are implemented inside the substrate die SU as SAW filter circuits whereas all interconnections and matching circuits MC are implemented inside the panel MLP that is usually a laminate or LTCC.

In this diagram, the two channels FC1, SP are connected together with a first general matching circuit MC1. A second matching circuit MC2 is arranged between antenna AN and a common node CN to which the two channels and the antenna are connected to. At this common node CN the connection line to the first filter circuit FC1 (cell path) may be very critical as it is sensitive to form a substantial parasitic inductance LP.

On one hand, this parasitic inductance LP often leads to a narrower passband and hence, provides worse nominal performance. On the other hand, the variation of the value of this inductance LP due to production tolerances (bump height variations etc.) leads to high performance variations that is usually a degradation.

The advantage of having all interconnections inside the panel is that the connection lines in a laminate or a LTCC usually have much larger line cross-section and therefore introduce less insertion loss.

The disadvantage of this known approach is the increased parasitic inductance which leads to reduced passband and increased production tolerances.

FIG. 2 shows the same block diagram with the supposed small difference that the common node CN combining all paths is now arranged on the surface of the substrate SU. Hence, the wiring that has formerly been completely arranged on the panel MLP is now in part on the substrate that is on the piezoelectric die or chip.

Surprisingly this small change has substantial effect on the sensitivity of the device to production tolerances. The parasitic inductance LP although still present in the circuit is now more stable and has substantially reduced impact on the properties of the filter device. The filter device comprises a first and a second matching circuit MC1, MC2 formed on and in the multilayer panel MLP. The first filter circuit FC1 and the signal path SP comprising a least a second filter circuit are formed and arranged on the surface of the substrate. However the common node CN is connected to the signal path SP on the chip. Moreover, the common node CN is directly connected to first and second matching circuit MC1, MC2. The other end or terminal of first matching circuit MC1 is connected to the first filter circuit. The second matching circuit that may comprise a parallel coil only is series connected between antenna AN common node CN.

All interconnection means ICM between substrate SU and panel MLP are realized as bumps. According to a common approach as shown in FIG. 2 for example the common node CN is implemented inside laminate to be connectable with first and second matching circuit. Solder bump to the signal path SP has formerly been located in the corner of the substrate SU according to a design requirement. Hence, there is a solder bump and a line inside substrate SU which has introduced a "parasitic" inductance into the circuit of the filter device and mainly into the signal path and its second or more filter circuits.

In a first step of a proposed design variation the solder bump is moved towards the filter circuit that is towards a first resonator of the filter circuit thereby reducing line length inside the substrate and ignoring design requirement. Hence, there is no bump in the corner of the substrate anymore. As a disadvantage this can lead to negative quality issues.

A second step of the proposed design variation again starts form former design as shown schematically in FIG. 2. The common node CN is moved away from the substrate corner towards inside of substrate SU thereby eliminating parasitic inductance of the solder bump and the routing inside the substrate. No design rule violations occur anymore as there is still a bump in the substrate corner. However an additional bump is required. With this variation the influence of production tolerance like a bump height tolerance is minimized.

FIG. 4 schematically shows an exemplary circuiting of the multilayer panel and the piezoelectric substrate according to an embodiment of the invention. In the figure panel MLP is depicted in a top view and substrate SU is depicted in a view onto the bottom surface thereof. Despite being connected by bumps as interconnection means ICM the connected surfaces of panel MLP and substrate SU are depicted separately for better understanding. The interconnections (depicted as lines) are formed between contact areas CA on the panel and pads PD on the substrate. For clarity reasons only some of the interconnections are shown. The device usually comprises a higher number of pads PD, contact areas CA and interconnection means ICM.

A second matching circuit MC2 serving to match the antenna AN to the filter circuits FC is arranged between antenna AN and antenna terminal AT on top of panel MLP. Antenna terminal AT is connected to a first pad PD1 on the substrate by an interconnection means ICM. The pad PD is connected by a first section SLS of a signal line on the surface of the substrate to a second pad representing the common CN. A first interconnection means ICM1 connects the common node to the panel and further to the first matching circuit MC1. A second interconnection means ICM2 connects the first matching circuit MC1 to a second pad PD2 on the substrate SU and further to the signal path SP and hence, to the at least one second filter circuit FC. Compared to the formerly known design the proposed filter device needs an additional bump (interconnection means ICM) connected to dependent on the perspective either to the first pad PD1 or to the common node CN. As before one bump/interconnection means connected to first pad PD1 and antenna terminal at is arranged in or near a corner CRN of the substrate SU.

FIG. 5 shows a simulated transfer curve between antenna AN and signal path SP around the GPS/GNSS band.

The figure shows three curves comparing the formerly used design to the improved design after first step and further to improved design. As can easily be seen there is no significant difference in GPS performance and the three lines comply nearly completely.

FIG. 6 shows the transfer curve between antenna AN and signal path around the GPS/GNSS band in a broad band depiction. The three curves are matching very well and confirm that there is no significant difference in GPS performance.

FIG. 7 shows three transfer curves simulated between antenna AN and first filter circuit FC1 in a broad band depiction. As can be seen there is no significant difference in the frequency range covering the bands of the signal path SP. The frequencies of interest in the signal path range from 617 MHz (band N71) to 4.2 GHz (band N77). There is no significant difference between the three curves in the bands below 3 GHz. However there is obvious and substantial difference in performance at frequencies above 3.5 GHz. Here the three curves are spreading. Curve 1 is assigned to the former design. Curve 2 corresponds to the design after first step of variation where the bump to antenna terminal is moved as close as possible to the signal path comprising SAW resonators. Curve 3 corresponds to the design after second step of variation wherein the common node CN is no on or inside the substrate SU. The embodiment according to curve 3 is the design after second step and shows a further improvement over curve 2 according to the design after first step. Curve 3 has the broadest band width and shows improved insertion loss near the right band edge at about 3.5 GHz.

This finding is confirmed by FIG. 8 showing the reflection curve (VSWR) of first filter circuit FC1 in a broad band depiction over all contained bands. Here too the reflection is substantially improved at frequencies above about 3 GHz. It can be seen that here too the three curves are spreading in this region.

FIG. 9 is a zoom-in of FIG. 7 and shows the amount of improvement in an enlarged depiction of the respective transfer curves that have been simulated for the signal path (including covered cell bands). A first comparison is made for those points on the curves having an attenuation value of −1 dB. These points occur at 3932 MHz (curve 1), 4023 MHz (curve 2) and 4057 MHz. A second comparison is made for the attenuation values at a given frequency. At 4.2 GHz an attenuation of −1.614 dB (curve 1), −1.359 dB (curve 2) and −1,267 dB (curve 3) is calculated. It can be seen that curve 3 according to the design after second step shows the best results in view of bandwidth respectively in view of attenuation at a given frequency.

FIG. 10 shows the amount of improvement of the respective reflection curves that have been simulated for the first filter circuit (including covered cell bands). A first comparison is made for those points on the curves having a reflection coefficient of 2. A second comparison is made for the reflection values at a given frequency. At 4.2 GHz reflection coefficients of 2,232 (curve 1), 2.013 (curve 2) and 1.896 (curve 3) are achieved. A reflection value of 2.0 is calculated to occur at 4108 MHz (curve 1), 4194 MHz (curve 2) and at 4249 MHz (curve 3). It can be seen that curve 3 according to the design after second step shows the best results in view of the frequency position of a given reflectivity respectively in view of reflection at a given frequency. Table 1 summarizes the results and findings:

TABLE 1

|  | Initial | After step 1 | After step 2 |
|---|---|---|---|
| IL at 4.2 GHz | 1.61 | 1.36 | 1.27 |
| Improvement to initial |  | 0.255 | 0.3469 |
| IL 1.0 at [MHz] | 3931.8 | 4022.6 | 4057.1 |
| Improvement to initial |  | 90.8 | 125.3 |
| VSWR at 4.2 GHz | 2.23 | 2.01 | 1.9 |
| Improvement to initial |  | 0.2188 | 0.3366 |
| VSWR 2.0 at [MHz] | 47108.3 | 4194.1 | 4248.6 |
| Improvement to initial |  | 85.8 | 140.3 |

FIGS. 11 to 13 show the sensitivity of different designs of filter devices to different bump heights. The respective lower diagram shows an enlarged section of the upper diagram as indicated by the dotted lines connecting a respective section of the respective upper diagram to the enlarged sectional depiction in the lower diagram.

FIG. 11 shows the right part of the transfer curve of an initial design before step 1 variation. Curve 4 correlates with the results for a bump height of 60 μm, curve 5 with the results for a bump height of 55 μm and curve 6 with the results for a bump height of 50 m. An enlarged section of this figure at the right band edge is depicted in the lower part of the figure to enable better visibility of differences. It can be seen that the broadest bandwidth is achieved with the lowest bump height (50 μm height/curve 6). This complies with the finding that a higher parasitic inductance resulting from a higher bump height has deleterious impact on the filter performance.

FIG. 12 shows in a similar depiction the right part of the transfer curve of a design after step 1 variation. It can be seen that the three curves have approached each other thereby reducing the differences.

FIG. 13 shows in a similar depiction the right part of the transfer curve of a design after step 2 variation. It can be seen that the three curves have further approached each other thereby nearly complying with each other. Hence, such a design has only a very small sensitivity to production tolerances like bump heights.

FIGS. 14A to 14C show the sensitivity of different designs of filter devices by regarding the reflectivity (VSWR) of these designs at different bump heights.

Similar to the illustration in FIGS. 11 to 13 filter designs after a step 1 variation show improved/lower sensitivity to tolerances. Filter designs after step 2 variation show lowest sensitivity. Curves 4, 5 and 6 correlate with the same bump heights as explained in view of FIGS. 11 to 13. It has been found (see FIG. 14A) that a known filter design before any variation shows a maximum frequency difference of 3330 ppm (about 14 MHz) a reflection coefficient of 2.0 for reflection curves relating to different bump heights. This difference is reduced to 1640 ppm (about 6.9 MHz) for filter designs after a step 1 variation (see FIG. 14B), and is further reduced to 330 ppm (about 1.3 MHz) after a step 2 variation. This is a significant stabilization against unavoidable tolerances, and helps to improve the device performance at the same time.

List of used terms and reference symbols

| AN | antenna |
|---|---|
| AT | antenna terminal |
| CA | contact area on the surface of the panel |
| CN | common node |
| CRN | corner of substrate |
| FC1 | first filter circuit |
| FC2 | second filter circuit |
| ICM1 | first and second interconnecting means |
| ICM2 | first and second end of the matching circuit |
| INS | series coil |
| LP | parasitic inductance |
| MC1, MC2 | first and second matching circuit |
| MLP | multilayer panel |
| PD1 | first pad |
| PD2 | second pad |
| SLS1 | first series line section |
| SLS2 | second series line section |
| SP | signal path |
| SU | piezoelectric substrate |
| 1-6 | simulated curves (admittance and VSWR) |

The invention claimed is:

1. A filter device comprising:
a multilayer panel with wiring;
a piezoelectric substrate mounted to the multilayer panel;
a first filter circuit;
a signal path comprising a second filter circuit, wherein the first filter circuit and the second filter circuit are both filter circuits being realized on a top surface of the piezoelectric substrate and connected to a common antenna terminal on the piezoelectric substrate;
a first matching circuit having a first end connected to the common antenna terminal on the piezoelectric substrate and a second end connected to the signal path with the second filter circuit, the first matching circuit including the wiring in the multilayer panel; and
a common node to which the first filter circuit, the signal path and the common antenna terminal are connected to, the common node being a pad located on the top surface of the piezoelectric substrate.

2. The filter device of claim 1,
wherein the first matching circuit realized by the wiring in the multilayer panel is circuited in a series line between the signal path and the common node;
wherein a first series line section arranged on the piezoelectric substrate connects the common node and a first pad;
wherein a second series line section arranged on the piezoelectric substrate connects a second pad and the signal path comprising the second filter circuit;
wherein a first interconnection connects the first pad to a first end of the first matching circuit; and
wherein a second interconnection connects the second pad to a second end of the first matching circuit.

3. The filter device of claim 1, wherein a second matching circuit is circuited between the common antenna terminal and the common node.

4. The filter device of claim 1, wherein at least one of the first and second filter circuits comprises SAW resonators.

5. The filter device of claim 1, the filter device being one of a Duplexer, a multiplexer or an extractor.

6. The filter device of claim 1, wherein the first filter circuit is a band pass filter for global positioning system (GPS) frequencies and/or global navigation satellite system (GNSS) signals.

7. The filter device of claim 6, wherein the signal path has a voltage standing wave ratio of less than 2 between 617 MHz and 4.2 GHz with except around the GPS/GNSS frequencies.

8. The filter device of claim 1, wherein the multilayer panel comprises one of a laminate, a high temperature co-fired ceramic (HTCC) and a low temperature co-fired ceramic (LTCC).

9. The filter device of claim 1,
  wherein a second matching circuit is circuited between the common antenna terminal and the common node,
  wherein the second matching circuit comprises a series coil to match an antenna to the first filter circuit and to the signal path.

10. The filter device of claim 1,
  wherein every interconnect between any pad on the piezoelectric substrate and a respective contact area on a surface of the multilayer panel comprises a bump, and
  wherein an interconnect between the common antenna terminal and a respective pad on the piezoelectric substrate is located near a corner of the piezoelectric substrate.

* * * * *